United States Patent [19]
Gardner et al.

[11] Patent Number: 5,943,562
[45] Date of Patent: Aug. 24, 1999

[54] SEMICONDUCTOR FABRICATION EMPLOYING A TRANSISTOR GATE COUPLED TO A LOCALIZED SUBSTRATE

[75] Inventors: Mark L. Gardner, Cedar Creek; Daniel Kadosh; Michael P. Duane, both of Austin, all of Tex.

[73] Assignee: Advanced Micro Devices, Inc.

[21] Appl. No.: 08/949,889

[22] Filed: Oct. 14, 1997

[51] Int. Cl.$^6$ ......................... H01L 21/336; H01L 21/762
[52] U.S. Cl. ......................... 438/152; 438/153; 438/219; 438/295; 438/405
[58] Field of Search ......................... 438/152, 153, 438/219, 295, 405, 479, 586, FOR 177, FOR 193, FOR 196, FOR 222

[56] References Cited

U.S. PATENT DOCUMENTS

| | | |
|---|---|---|
| 4,596,604 | 6/1986 | Akiyama et al. |
| 4,902,637 | 2/1990 | Kondou et al. |
| 5,223,450 | 6/1993 | Fujino et al. |
| 5,399,519 | 3/1995 | Madoubian |
| 5,492,851 | 2/1996 | Ryou |
| 5,547,886 | 8/1996 | Harada |
| 5,593,915 | 1/1997 | Ohoka |
| 5,670,390 | 9/1997 | Muragishi |
| 5,747,367 | 5/1998 | Kadosh et al. |
| 5,770,483 | 6/1998 | Kadosh et al. |

Primary Examiner—George R. Fourson
Attorney, Agent, or Firm—Kevin L. Daffer; Conley, Rose & Tayon

[57] ABSTRACT

A method is provided for forming a transistor in which the gate is coupled to a second substrate dielectrically spaced above a first substrate. According to an embodiment, a polysilicon layer is formed across an interposing dielectric layer which is disposed across a single crystalline silicon substrate. The polysilicon layer is doped, making it the second semiconductor substrate. Trench isolation structures may be formed within the second substrate between ensuing active areas. A gate oxide is formed across the second substrate, and an opening is etched through the gate oxide down to the second substrate. A conductive material is formed within the opening, and polysilicon is deposited across the gate oxide. The polysilicon may be etched to form a gate conductor above the gate oxide. LDD implant areas are formed within the second substrate between the gate conductor and adjacent isolation structures. Dielectric spacers are formed upon the opposed sidewall surfaces of the gate conductor, and S/D regions are formed within the second substrate. The S/D implant is self-aligned to the exposed lateral edges of the dielectric spacers. The resulting transistor may be switched on quickly and has reduced current leakage in the off state. Transistors formed within and upon the first substrate are isolated from noise which may be induced in the second substrate.

13 Claims, 5 Drawing Sheets

SEMICONDUCTOR FABRICATION EMPLOYING A TRANSISTOR GATE COUPLED TO A LOCALIZED SUBSTRATE

BACKGROUND OF THE INVENTION

1. Field of the Invention

This invention relates to integrated circuit fabrication and, more particularly, to forming a transistor upon a semiconductor substrate in which the gate is coupled to the substrate to enhance performance of the transistor.

2. Description of the Relevant Art

Fabrication of a MOSFET device is well known. Generally speaking, MOSFETs are manufactured by placing an undoped polycrystalline ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Because of the increased desire to build faster and more complex integrated circuits, it has become necessary to form relatively small, closely spaced multiple transistors within a single integrated circuit. Unfortunately, as device dimensions shrink, problems associated with subthreshold current, $I_{Dst}$, become paramount. Subthreshold current is current flowing between the drain and source of a transistor when the device is turned off and the gate-to-source voltage, $V_{GS}$, of the transistor is less than the absolute value of the transistor threshold voltage, $V_T$. Ideally, no current flows between the drain and source if $V_{GS}$ is less than $|V_T|$, however, this is not the case when $V_{GS}$ approaches $V_T$. Even relatively small values of $I_{Dst}$ can adversely affect the performance of a device. For example, subthreshold current can leak to and from the output node of each logic cell of a dynamic circuit (e.g., sequential, clocked circuit), and thereby prevent output signals from achieving and maintaining the desired $V_{DD}$ and $V_{ss}$ values. The dynamic circuit may even fail if data become lost because of the leaking current. The presence of subthreshold current flow can also add undesirable power consumption in static circuits employed in, for example, combinational logic.

Short-channel effects ("SCE") which can cause the values of $I_{Dst}$ to increase are related to devices of sub-micron dimensions. Two of the main SCE which affect the values of $I_{Dst}$ are punchthrough and drain-induced barrier lowering. Punchthrough is normally observed when $V_{GS}$ is well below $V_T$. It occurs as a result of the widening of the drain depletion region when the reverse-bias voltage on the drain is increased. The electric field of the drain may eventually penetrate into the source region, and thereby reduce the potential energy barrier of the source-to-body junction. As a result, majority carriers in the source region may gain enough energy to overcome the barrier, leading to an increased current flow from the source to the body. Some of this punchthrough current may be collected by the drain, causing an increase in $I_{Dst}$. Similarly, the application of a drain voltage to a short-channel device can lead to drain-induced barrier lowering ("DIBL"). The drain voltage can cause the potential energy barrier at the substrate surface to be lowered, resulting in an increase in $I_{Dst}$ in the channel region at the gate oxide/substrate interface. As $V_{GS}$ approaches $V_T$, the subthreshold current at the surface due to DIBL becomes larger.

It is therefore desirable to develop a technique for fabricating an integrated circuit which can quickly transistion between logic states (i.e., operate at high frequencies) without incurring subthreshold current, $I_{Dst}$. Reducing the switching speed (from off to on and vice versa) of the logic gates of an integrated circuit is necessary to more quickly receive a response from an integrated circuit. Unfortunately, for ULSI devices, even a small value of leakage current per device may not be tolerable. Sacrificing device reliability for smaller device dimensions is not a viable option. Thus, it would be beneficial to form an integrated circuit in which source-to-drain current flow does not occur even when device dimensions are reduced and switching speeds are increased.

SUMMARY OF THE INVENTION

The problems outlined above are in large part solved by the technique hereof for fabricating a transistor in which the gate conductor is electrically linked to a second semiconductor substrate which is spaced above a first semiconductor substrate. The threshold voltage, $V_T$, is advantageously decreased while the transistor is switched on, resulting in faster transistor switching. In other words, the value of the gate-to-source voltage, $V_{GS}$, required to invert the channel underneath the gate conductor such that a drive current, $I_D$, flows between the source and drain regions of the transistor is decreased. Further, when the transistor is in its off state, $V_T$ is increased, resulting in reduced current leakage between the source and drain regions. This increase in $V_T$ results in an increase in the amount of $V_{GS}$ sufficient to cause subthreshold current to flow from source to drain. That is, a higher $V_{GS}$ is necessary to approach the value of $V_T$ without exceeding it. Coupling the gate conductor to the substrate employed by the transistor (and thereby decreasing $V_T$) thus leads to an increase in saturation drive current, $I_{DSAT}$, according to the following relation:

$$I_{DSAT} = K/2 * (V_G - V_T)^2,$$

where K is a value derived as a function of the process parameters used in producing the transistor. In the "saturated" state of a transistor, the drive current is controlled by the gate voltage and is virtually independent of drain voltage.

Since the gate conductor is connected to the second substrate, applying $V_{GS}$ to the gate conductor also results in a voltage being applied to the surface of that substrate. The contact formed between the gate conductor and the underlying substrate is in close proximity to the channel region. Applying a voltage to the substrate is believed to offset the difference between gate and bulk substrate potentials ("effective gate voltage") and to change the width of the depletion layer in the substrate induced by $V_{GS}$. It is postulated that when an NMOSFET transistor is being turned on, the positive value of $V_{GS}$ will lead to the surface of the second substrate near the channel region having a higher potential than the bulk substrate. As a result, the positive charge of the substrate surface combined with that of the gate conductor may attract more electron charge carriers than if only the gate conductor were charged. A lower overall $V_{GS}$ may be required to invert the channel region from p-type to n-type so that a drive current flows between the source and drain. A similar mechanism is believed to occur for a PMOSFET transistor as well. Thus, it is believed that the $V_T$ of such a transistor may be reduced when the transistor is switched on.

During the off state of a transistor in which the gate conductor is connected to the second substrate, any voltages to the gate, $V_{GS}$, also communicate with the surface of the second substrate. Noise in the surrounding environment may be the source of such voltages which are less than $V_T$. As a result, it is believed that the surface of the substrate becomes slightly charged with respect to the bulk substrate. It is postulated that oppositely charged carriers may be attracted to the surface of the substrate for the purpose of maintaining charge neutrality. Particularly, carriers in the source region may flow to and neutralize the charged region of the substrate, and thus punchthrough current may be prevented from traveling to the drain region. Further, it is theorized that the substrate voltage adds to the channel-substrate junction potential, and thus helps counter drain-induced barrier lowering at the surface of the substrate. Therefore, it is believed that $V_T$ of such a transistor in its off state is increased.

One embodiment of the present invention contemplates the formation of a transistor within and upon a second semiconductor substrate. The second semiconductor substrate is preferably composed of doped polysilicon. An interposing dielectric layer is arranged between the second semiconductor substrate and an underlying first substrate composed of doped single crystalline silicon. Transistor formation involves first depositing polysilicon across the interposing dielectric layer and forwarding dopant species into the polysilicon. The ensuing transistor is then dielectrically isolated from adjacent active areas by forming, e.g., trench isolation structures filled with oxide within the second semiconductor substrate adjacent to the source and drain regions of the transistor. A relatively thin gate oxide is thermally grown across the surface of the second substrate. An opening is formed through the gate oxide down to the second substrate.

Polysilicon may be deposited into the opening and across the gate oxide. Portions of the gate oxide and the polysilicon may then be etched to form a gate conductor dielectrically spaced above and in electrical communication with the second substrate. Alternately, another dielectric layer may be formed across a portion of the gate oxide, and the opening may be formed such that it extends through both the dielectric layer and the gate oxide. A conductive plug may be formed within the opening, and then polysilicon may be deposited across the conductive plug, the dielectric layer, and the gate oxide prior to forming the gate conductor. Subsequent to gate conductor formation, a lightly doped drain "LDD" implant which is self-aligned between the opposed sidewalls surfaces of the gate conductor and the isolation structures may be forwarded into the second substrate. Oxide spacers may be formed upon the sidewall surfaces of the gate conductor. Source/drain regions of the second substrate may then be heavily doped with an implant which is self-aligned to the exposed lateral edges of the oxide spacers.

The gate conductor of the resulting transistor is advantageously coupled to the second semiconductor substrate. As a result, the transistor can be switched on more easily, providing for a faster operating integrated circuit which employs the transistor. Further, the transistor undergoes less current leakage when it is in its off state. Since the gate conductor is connected to the second substrate, noise may be induced in the second substrate whenever $V_{GS}$ is applied to the gate. The noise, however, is dielectrically isolated from the first semiconductor substrate. Dielectrically removing the second substrate from the first substrate helps protect the transistors formed within the first substrate from being affected by the noise induced in the second substrate. Preferably, transistors which have the gate conductor coupled to a substrate are to be formed upon the second semiconductor substrate. Transistors not having the gate conductor coupled to a substrate are to be formed upon the first substate such that they are dielectrically isolated from noise induce into sseond substate from high speed switching of gate conductor, exclusively utilizing the second substrate.

BRIEF DESCRIPTION OF THE DRAWINGS

Other objects and advantages of the invention will become apparent upon reading the following detailed description and upon reference to the accompanying drawings in which:

FIG. 6a is a plan view along plane 5 of FIG. 5, wherein a gate oxide having an opening extending down to the second semiconductor substrate is formed across the second substrate, subsequent to the step in FIG. 5;

FIG. 6b is a plan view along plane 5 of FIG. 5, wherein a gate oxide is formed across the second the and a dielectric is formed across a portion of the gate oxide, and wherein opening is formed through the dielectric and the gate oxide down to the second substrate, alternate to the step in FIG. 6a;

FIG. 7a is a plan view along plane 5 of FIG. 5, wherein a conductive material is formed within the opening down to the second semiconductor substrate and polysilicon is deposited across gate dielectric, subsequent to the step in FIG. 6a;

FIG. 7b is a plan view along plane 5 of FIG. 5, wherein a conductive material is formed within the opening down to the second semiconductor substrate and polysilicon is deposited ac the gate oxide and the dielectric, subsequent to the step in FIG. 6b and alternate to the step in FIG. 7a;

DETAILED DESCRIPTION OF THE INVENTION

Figure 1:
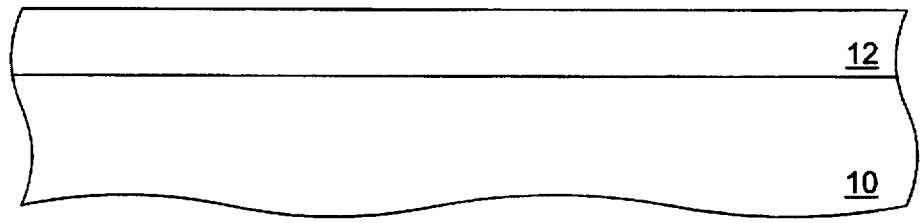
FIG. 1 is a crosss-sectional view of a semiconductor topography, wherein a dielectric lay Iformed across a first semiconductor substrate.
Figure 2:
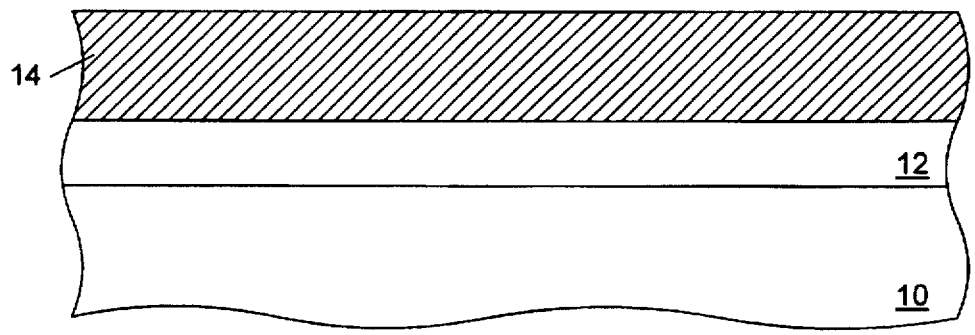
FIG. 2 is a cross-sectional view of the semiconductor topography, wherein polysilicon is deposited across the dielectric layer to form a second semiconductor substrate, bsequent to the step in FIG. 1.
Figure 3:
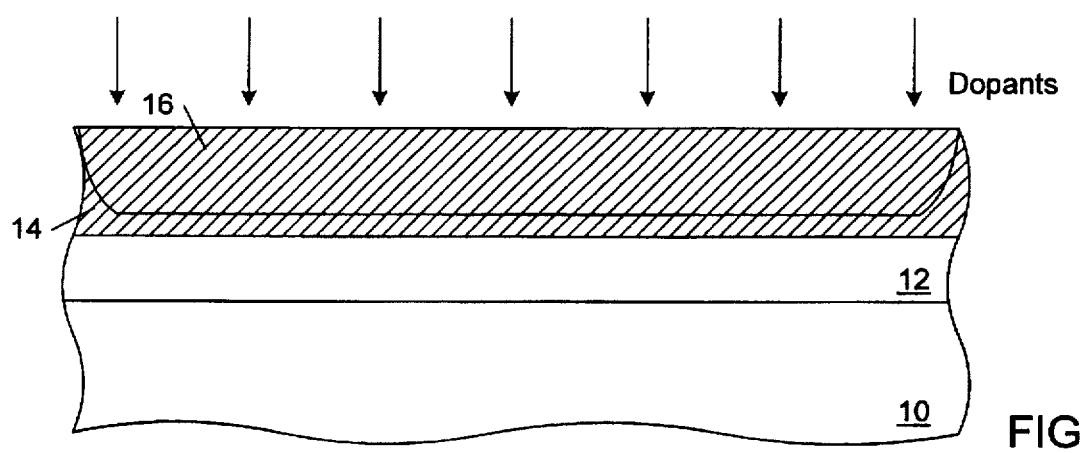
FIG. 3 is a crsos-sectional view of the semiconductor topography, wherein an implant is ford into the second semiconductor substrate to form a doped well therein, subsequent to the step in FIG. 2.

Turning now to the drawings, FIG. 1 illustrates a dielectric layer 12 being formed across a single crystalline silicon substrate 10. Dielectric layer 12 may be formed by e.g., using chemical vapor deposition ("CVD") to deposit silicon dioxide ("oxide") across the surface of first substrate 10. The CVD of this oxide may involve subjecting substrate 10 to a silane and oxygen entrained gas within a reaction chamber, thereby promoting the reaction of silane and oxygen upon the surface of the substrate. As shown in FIG. 2, CVD of polysilicon from, e.g., a silane source may then be used to form a second substrate 14 across dielectric layer 12. FIG. 3 depicts the formation of a doped well 16 within second substrate 14. Well 16 may be formed by forwarding dopants into a select area of second substrate 14. Preferably, if a PMOS integrated circuit is being formed, ion implantation of n-type species is performed. On the other hand, if an NMOS integrated circuit is being formed, p-type species are implanted into second substrate 14. Some commonly used n-type dopants are arsenic or phosphorus, and some commonly used p-type dopants are boron or boron difluoride. Alternately, one region of substrate 14 may be implanted with p-type dopants while another region is implanted with n-type dopants. Each of these regions may be masked in sequential steps during the implantation of the other region. The resulting substrate would have both an n-well and a p-well, permitting the formation of a complementary MOS ("CMOS") integrated circuit.

Figure 4:
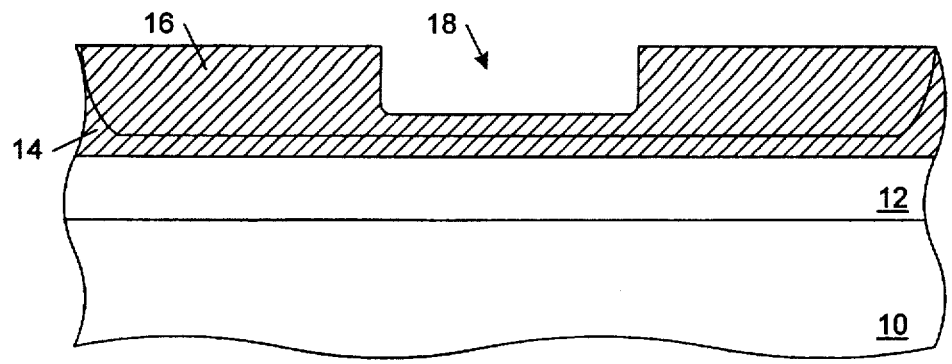
FIG. 4 is a cross-sectional view of the semiconductor topography, wherein an isolation is etched in the second semiconductor substrate, subsequent to the step in FIG. 3.
Figure 5:
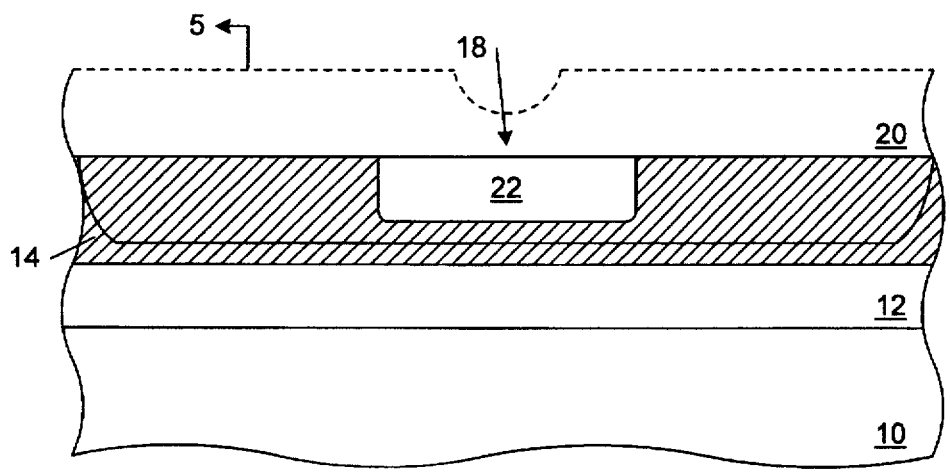
FIG. 5 is a.cross-sectional view of the semiconductor topography, wherein dielectric material is deposited into the trench to form a trench isolation structure between actives of the second semiconductor substrate, subsequent to the step in FIG. 4.

Turning to FIG. 4, an isolation trench 18 may be formed within the upper portion of second substrate 14. Trench 18 may be formed by first patterning a photoresist masking layer using optical lithography over second substrate 14 exclusive of where the trench is to be formed. An etch technique, e.g., a plasma etch may then be performed to remove the unmasked portion of substrate 14 down to a pre-defined depth. As illustrated in FIG. 5, a dielectric material, such as oxide may be CVD deposited into trench 18 and across the surface of second substrate 14. A portion 20 of the deposited oxide may then be removed down to a level commensurate with the upper surface of second substrate 14 using, e.g., chemical-mechanical polishing ("CMP") or an etchback technique. As a result, a shallow trench isolation structure 22 is formed within second substrate 14 which may function to isolate subsequently formed active areas of the substrate. Alternately, an isolation structure may be formed using the local oxidation of silicon ("LOCOS") technique.

Figure 6:
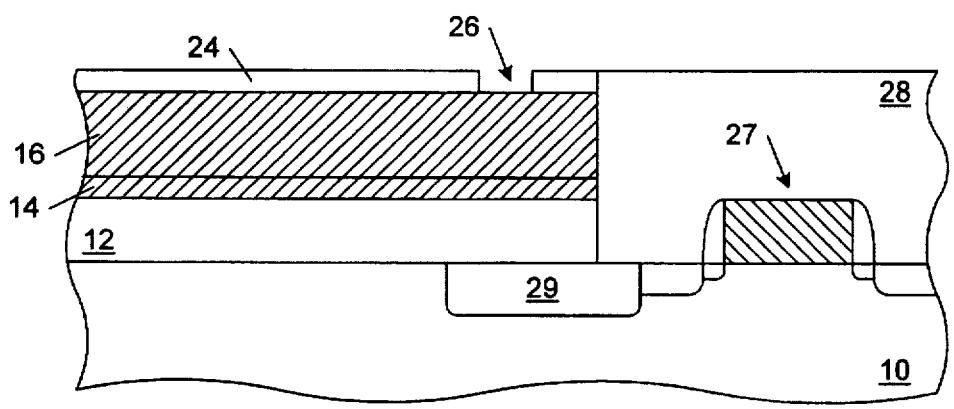

FIG. 6a depicts a plan view of the semiconductor topography along plane 5 of FIG. 5, according to one embodiment of the present invention. A gate oxide 24 is thermally grown across the upper surface of second substrate 14. A portion of gate oxide 24 is removed to form an opening 26 extending down to the surface of substrate 14. Opening 26 may be formed by using optical lithography and an etch technique, such as a plasma etch. Etch duration is selected to terminate before substantial portions of the surface of second substrate 14 can be etched away. As shown in FIG. 6a, an interlevel dielectric 28 may be arranged across a portion of first substrate 10 and transistor 27 which is formed within and above substrate 10. Transistor 27 may be dielectrically isolated from other transistors formed within first substrate 10 with trench isolation structures, such as structure 29. The upper surface of interlevel dielectric may be polished to make it level with the upper surface of gate oxide 24.

Figure 6B:
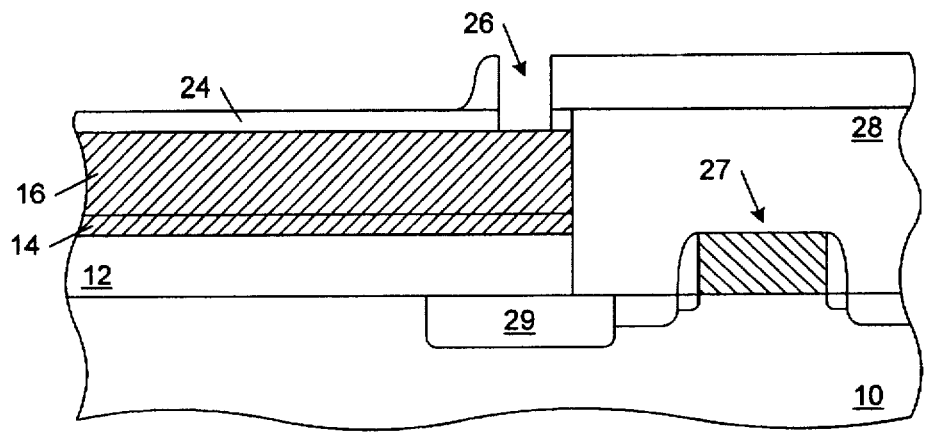

FIG. 6b depicts an embodiment alternate to the one depicted in FIG. 6a. In this embodiment, gate oxide 24 is also thermally grown across second substrate 14. However, interlevel dielectric 28 is not only formed across first substrate 10 but is also formed across gate oxide 24. A portion of interlevel dielectric 28 is removed from above the gate oxide using, e.g., a plasma etch step to prepare for subsequent gate conductor formation thereon. Interlevel dielectric 28 remains disposed across a portion of the periphery of gate oxide 24. Opening 26 is preferably etched vertically through that portion of interlevel dielectric 28 and gate oxide 24 down to second substrate 14.

Figure 7A:
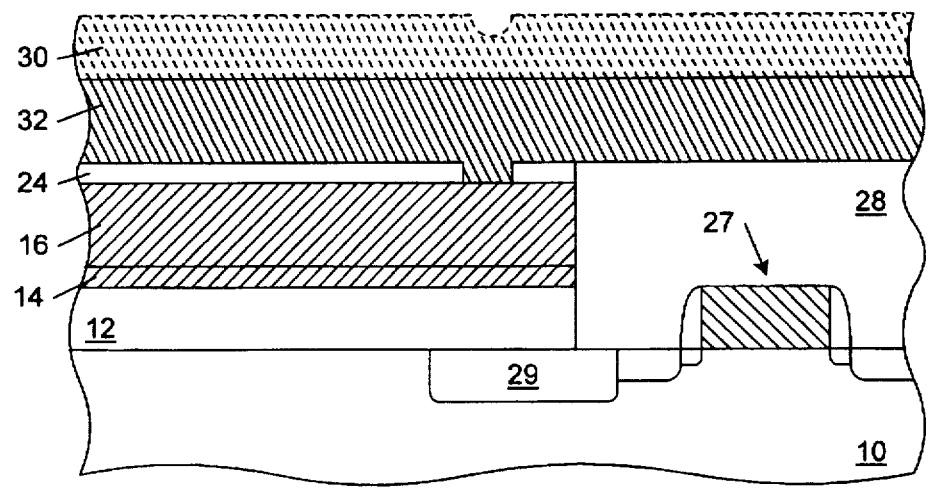
Figure 7B:
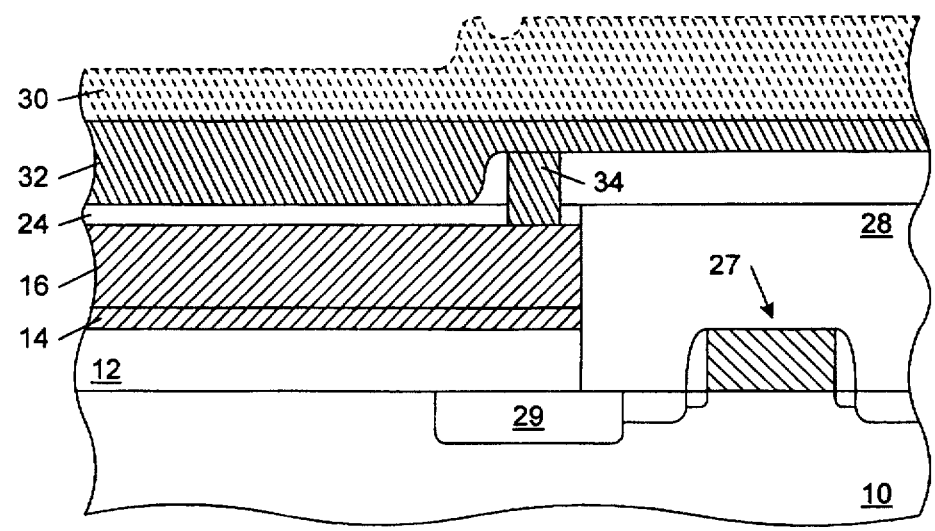

FIG. 7a and FIG. 7b depict processing steps which are performed subsequent to the steps shown in FIGS. 6a and 6b, respectively. As illustrated in FIG. 7a, polysilicon 32 may be CVD deposited across gate oxide 24 and interlevel dielectric 28 and into opening 26 such that it contacts second substrate 14. A portion 30 of the polysilicon 32 may be removed using, for example, CMP. As shown in FIG. 7b, instead of forming polysilicon 32 within opening 26, a conductive plug 34 may be formed within the opening. Conductive plug 34 may be formed by depositing a conductive material, e.g., titanium and/or tungsten, into opening 26 and across interlevel dielectric 28 and gate oxide 24. A wet etch highly selective to the plug fill material, may then be used to remove the material from above all areas except opening 26. The remaining plug fill material may then be removed down to a level equivalent to the upper surface of interlevel dielectric 28 using, e.g., CMP. Polysilicon may be deposited across the resulting conductive plug 34.

Figure 8:
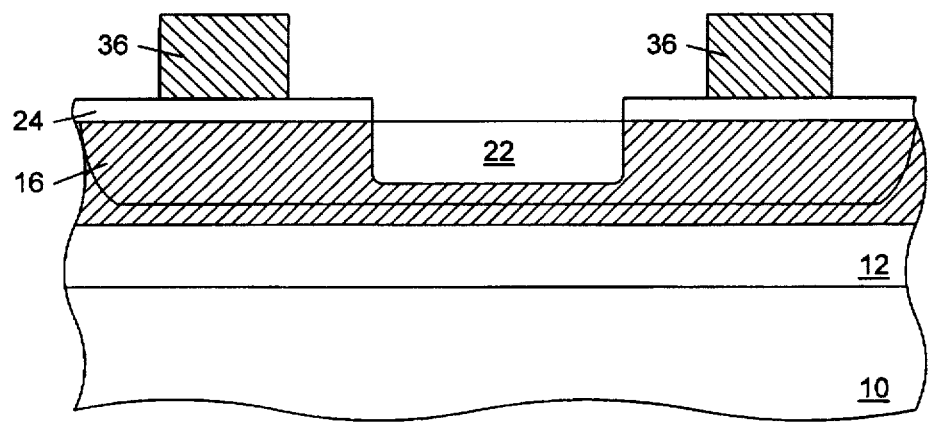
FIG. 8 is a cross-sectional view of the semiconductor topography along the plane of FIGS. 1–5 wherein portions of the polysilicon are removed to form gate conductors which are spaced from each other, subsequent to the step in FIG. 7 (7a or 7b)
Figure 9:
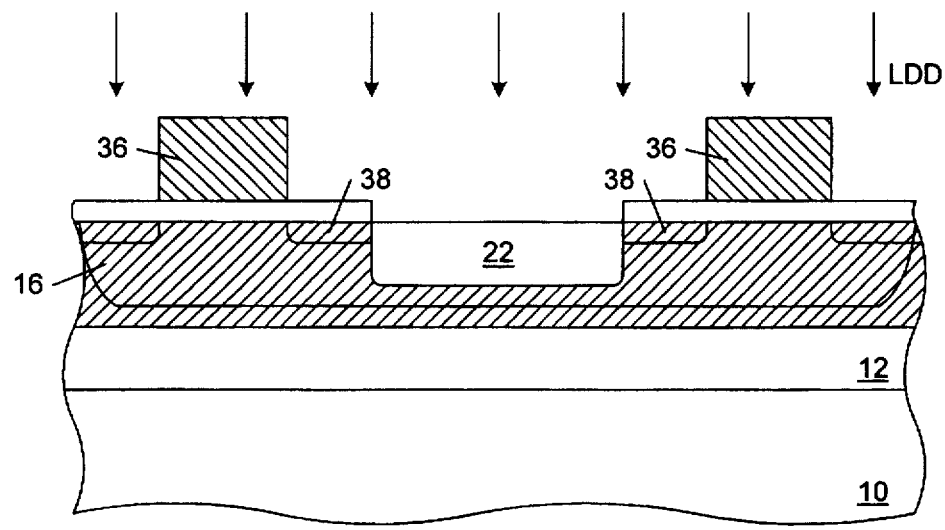
FIG. 9 is cross-setional view of the semiconductor topography, wherein an LDD implant is foned into regions of the second semiconductor substrate which are not masked by the gate conductors, subsequent to the step in FIG. 8.
Figure 10:
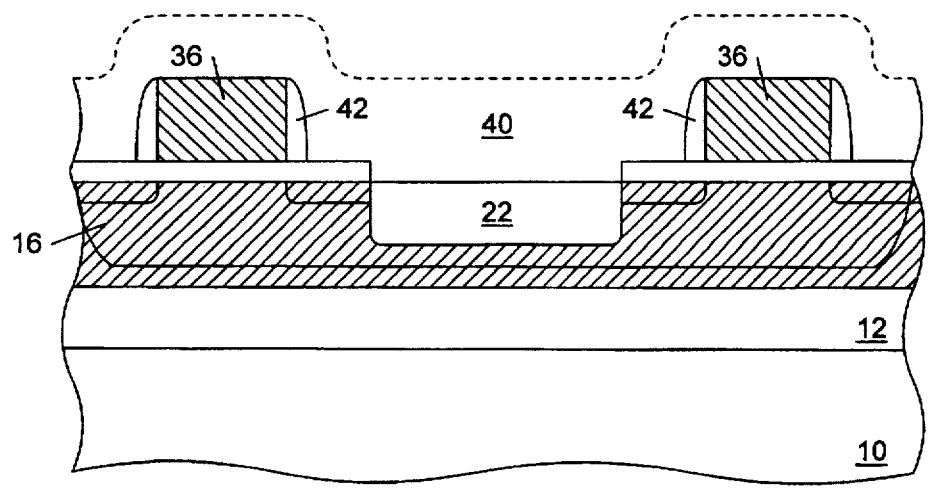
FIG. 10 is a cross-sectional view of the semiconductor topography, wherein dielectric spacers are formed upon the opposed sidewall surfaces of the gate conductors, subsequent to the step in FIG. 9.
Figure 11:
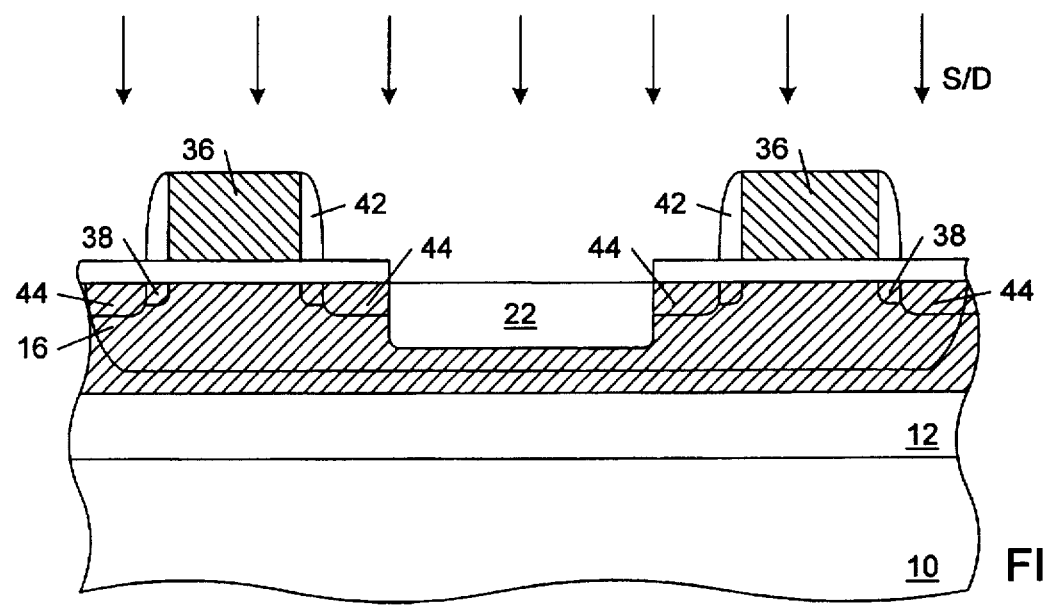
FIG. 11 is cross-sectional view of the semiconductor topography, wherein a S/D implant which is self-aligned to the exposed lateral surfaces of the dielectric spacers is forwarded into regions of the second semiconductor substrate, subsequent to the step in FIG. 10.

Turning to FIG. 8, a cross-section commensurate with that of FIGS. 1–5 is shown undergoing a subsequent fabrication step. Portions of polysilicon 32 may be removed using optical lithography and an etch method, such as a dry, plasma etch. As a result, polysilicon gate conductors 36 are formed upon gate oxide 24. As shown in FIG. 9, an LDD implant may then be forwarded into portions of well 16 of second substrate 14. The LDD implant is aligned to the opposed sidewall surfaces of gate conductors 36, and thereby leads to the formation of LDD areas 38 between gate conductors 36 and trench isolation structure 22. The LDD areas 38 preferably contain a light concentration of dopants that are opposite in type to the dopants previously implanted in well 16. Turning to FIG. 10, a dielectric material, such as oxide or nitride, may then be CVD deposited across exposed portions of second substrate 14 and gate conductors 36. An anisotropic etch in which ion ablation occurs more quickly upon horizontal surfaces than vertical surfaces may then be performed to remove portion 40 of the dielectric material. Dielectric spacers 42 are thusly formed upon the opposed sidewalls surfaces of gate conductor 36. Subsequently, a heavy concentration S/D implant is self-aligned to the exposed lateral surfaces of dielectric spacers 42, as shown in FIG. 11. During this implantation step, dopants are also forwarded into gate conductors 36 such that the conductivity of the gate conductors is increased. The dopants used for the S/D implant are of the same type as those used for the LDD implant. The resulting transistors have graded junctions in which dopant concentration increases laterally in a direction away from gate conductors 36. In other words, S/D regions 44 are formed within well 16 which are more heavily concentrated with dopants than LDD areas 38.

Figure 12:
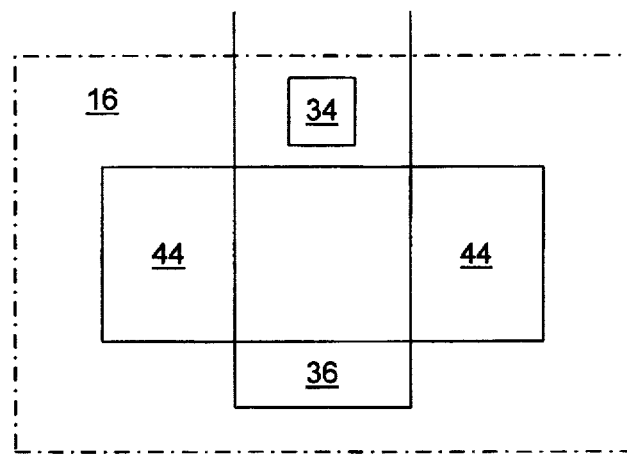
FIG. 12 is a partial to view of the semiconductor topography.

FIG. 12 depicts a top plan view of one of the fabricated transistors. Source and drain regions 44 are arranged within second substrate 14 on opposite sides of polysilicon gate conductor 36. A conductive plug 34 extends vertically between gate conductor 36 and the underlying second substrate 14. Thus, gate conductor 36 is in electrical communication with second substrate 14. The transistors formed using the method hereof exhibit advantageous features compared with conventional transistors. When these transistors are turned on, they have a lower $V_T$ which allows them to be switched on more quickly than conventional transistors, and can be used to build faster operating transistors. Further, these transistors have a higher $V_T$ when they are in their off state. Therefore, these transistors have less problems associated with subthreshold currents than other modern transistors, despite being ULSI devices.

It will be appreciated to those skilled in the art having the benefit of this disclosure that this invention is believed to provide a method for forming a transistor in which the gate is electrically connected to the substrate upon which the transistor is formed, wherein this substrate is dielectrically isolated from another substrate. Further modifications and alternative embodiments of various aspects of the invention will be apparent to those skilled in the art in view of this description. For example, multiple transistors may be formed upon and within both semiconductor substrates, contacts may be made to the transistors, and interconnect routing isolated above the transistors may be formed between the contacts. It is intended that the following claims be interpreted to embrace all such modifications and changes and, accordingly, the specification and drawings are to be regarded in an illustrative rather than a restrictive sense.

What is claimed is:

1. A method for forming a transistor, comprising:

providing a first semiconductor substrate upon which at least one transistor is formed;

depositing a second semiconductor substrate a dielectrically spaced distance above the first semiconductor substrate;

forming a gate dielectric across said second semiconductor substrate;

etching an opening vertically through said gate dielectric down to said second semiconductor substrate;

forming conductive material within said opening, and depositing polysilicon across said gate dielectric; and removing portions of said polysilicon to form a gate conductor electrically coupled to said second semiconductor substrate.

2. The method of claim 1, wherein said second semiconductor substrate comprises doped polysilicon, and wherein said first semiconductor substrate comprises doped single crystalline silicon.

3. The method of claim 1, wherein the step of forming said gate dielectric comprises thermally growing oxide upon said second semiconductor substrate.

4. The method of claim 1, wherein an interposing oxide layer is disposed between said first and second semiconductor substrates.

5. The method of claim 1, further comprising:

implanting into said second semiconductor substrate a first dopant which is self-aligned to opposed sidewall surfaces of said gate conductor to form lightly doped drain areas within said second semiconductor substrate;

forming dielectric spacers upon said opposed sidewall surfaces; and implanting into said second semiconductor substrate a second dopant which is self-aligned to exposed lateral edges of said dielectric spacers to form source and drain regions within said second semiconductor substrate a spaced distance from said opposed sidewall surfaces.

6. The method of claim 1, further comprising forming a trench isolation structure within said second semiconductor substrate prior to the step of forming said gate dielectric, wherein said trench isolation structure comprise a fill dielectric disposed within a trench.

7. The method of claim 4, further comprising removing portions of said gate dielectric, said second semiconductor substrate, and said interposing dielectric layer to expose portions of said first semiconductor substrate for forming another transistor arranged within and upon said first semiconductor substrate.

8. A method for forming a transistor, comprising:

providing an interposing dielectric layer disposed between first and second semiconductor substrates, and providing a gate dielectric disposed across said second semiconductor substrate;

forming a dielectric material across a portion of said gate dielectric;

etching an opening vertically through said dielectric material and said portion of the gate dielectric down to said second semiconductor substrate;

forming conductive material within said opening, and depositing polysilicon across said gate dielectric and said dielectric material; and removing portions of said polysilicon to form a gate conductor electrically coupled to said second semiconductor substrate.

9. The method of claim 8, wherein said second semiconductor substrate comprises doped polysilicon, and wherein said first semiconductor substrate comprises doped single crystalline silicon.

10. The method of claim 8, wherein said gate dielectric comprises thermally grown oxide, and wherein said interposing dielectric layer comprises CVD deposited oxide.

11. The method of claim 8, further comprising removing portions of said gate dielectric, said second semiconductor substrate, and said interposing dielectric layer to expose portions of said first semiconductor substrate prior to the step of forming said dielectric material.

12. The method of claim 8, further comprising forming said dielectric material across said exposed portions of the first semiconductor substrate concurrent with the step of forming said dielectric material across said periphery portion.

13. The method of claim 8, further comprising:

implanting a first dopant which is self-aligned to opposed sidewall surfaces of said gate conductor into said second semiconductor substrate, thereby forming lightly doped drain areas within said second semiconductor substrate;

forming dielectric spacers upon said opposed sidewall surfaces; and implanting a second dopant which is self-aligned to exposed lateral edges of said dielectric spacers into said second semiconductor substrate, thereby forming source and drain regions within said second semiconductor substrate a spaced distance from said opposed sidewall surfaces.

* * * * *